(12) United States Patent
Lubomirsky et al.

(10) Patent No.: US 8,232,176 B2
(45) Date of Patent: Jul. 31, 2012

(54) DIELECTRIC DEPOSITION AND ETCH BACK PROCESSES FOR BOTTOM UP GAPFILL

(75) Inventors: Dmitry Lubomirsky, Cupertino, CA (US); Srinivas D. Nemani, Sunnyvale, CA (US); Ellie Yieh, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 11/765,944

(22) Filed: Jun. 20, 2007

(65) Prior Publication Data
US 2007/0298585 A1 Dec. 27, 2007

Related U.S. Application Data

(60) Provisional application No. 60/805,573, filed on Jun. 22, 2006.

(51) Int. Cl.
*H01L 21/762* (2006.01)

(52) U.S. Cl. . 438/424; 438/428; 438/436; 257/E21.546; 257/E21.279

(58) Field of Classification Search .......... 438/435, 438/702, FOR. 227, 424, 428, 436; 257/E21.546, 257/E21.279
See application file for complete search history.

(56) References Cited

U.S. PATENT DOCUMENTS

| | | | |
|---|---|---|---|
| 4,147,571 A | 4/1979 | Stringfellow et al. | |
| 4,816,098 A * | 3/1989 | Davis et al. | 156/345.31 |
| 4,818,326 A * | 4/1989 | Liu et al. | 156/345.36 |
| 4,931,354 A | 6/1990 | Wakino et al. | |
| 5,016,332 A | 5/1991 | Reichelderfer et al. | |
| 5,110,407 A | 5/1992 | Ono et al. | |
| 5,271,972 A | 12/1993 | Kwok et al. | |
| 5,393,708 A | 2/1995 | Hsia et al. | |
| 5,426,076 A | 6/1995 | Moghadam | |
| 5,468,687 A | 11/1995 | Carl et al. | |
| 5,530,293 A | 6/1996 | Cohen et al. | |
| 5,558,717 A | 9/1996 | Zhao et al. | |
| 5,587,014 A | 12/1996 | Lyechika et al. | |
| 5,622,784 A | 4/1997 | Okaue et al. | |

(Continued)

FOREIGN PATENT DOCUMENTS

DE 19654737 A1 7/1997

(Continued)

OTHER PUBLICATIONS

Gulleri, G. et al., "Deposition Temperature Determination of HDPCVD Silicon Dioxide Films," 2005, Microelectronic Engineering, vol. 82, pp. 236-241.

(Continued)

*Primary Examiner* — George Fourson, III
(74) *Attorney, Agent, or Firm* — Kilpatrick Townsend & Stockton LLP

(57) ABSTRACT

Methods to reduce film cracking in a dielectric layer are described. The methods may include the steps of depositing a first dielectric film on a substrate and removing a top portion of the first dielectric film by performing an etch on the film. The methods may also include depositing a second dielectric film over the etched first film, and removing a top portion of the second dielectric film. In addition, the methods may include annealing the first and second dielectric films to form the dielectric layer, where the removal of the top portions from the first and the second dielectric films reduces a stress level in the dielectric layer.

6 Claims, 12 Drawing Sheets

U.S. PATENT DOCUMENTS

| | | | |
|---|---|---|---|
| 5,635,409 A | 6/1997 | Moslehi | |
| 5,665,643 A | 9/1997 | Shin | |
| 5,691,009 A | 11/1997 | Sandhu | |
| 5,786,263 A * | 7/1998 | Perera | 438/431 |
| 5,853,607 A | 12/1998 | Zhao et al. | |
| 5,935,340 A | 8/1999 | Xia et al. | |
| 5,937,308 A | 8/1999 | Gardner et al. | |
| 5,937,323 A | 8/1999 | Orczyk et al. | |
| 6,008,515 A | 12/1999 | Hsia et al. | |
| 6,009,830 A | 1/2000 | Li et al. | |
| 6,014,979 A | 1/2000 | Van Autryve et al. | |
| 6,024,044 A | 2/2000 | Law et al. | |
| 6,087,243 A * | 7/2000 | Wang | 438/424 |
| 6,090,442 A | 7/2000 | Klaus et al. | |
| 6,090,723 A | 7/2000 | Thakur et al. | |
| 6,114,219 A | 9/2000 | Spikes et al. | |
| 6,121,130 A | 9/2000 | Chua et al. | |
| 6,140,242 A * | 10/2000 | Oh et al. | 438/698 |
| 6,146,970 A * | 11/2000 | Witek et al. | 438/424 |
| 6,156,394 A | 12/2000 | Yamasaki et al. | |
| 6,156,581 A | 12/2000 | Vaudo et al. | |
| 6,165,834 A | 12/2000 | Agarwal et al. | |
| 6,180,490 B1 | 1/2001 | Vassiliev et al. | |
| 6,207,587 B1 | 3/2001 | Li et al. | |
| 6,287,962 B1 | 9/2001 | Lin | |
| 6,302,964 B1 | 10/2001 | Umotoy et al. | |
| 6,383,954 B1 | 5/2002 | Wang et al. | |
| 6,387,207 B1 | 5/2002 | Janakiraman et al. | |
| 6,406,677 B1 | 6/2002 | Carter et al. | |
| 6,448,187 B2 | 9/2002 | Yau et al. | |
| 6,469,283 B1 | 10/2002 | Burkhart et al. | |
| 6,503,557 B1 | 1/2003 | Joret | |
| 6,506,253 B2 | 1/2003 | Sakuma | |
| 6,508,879 B1 | 1/2003 | Hashimoto | |
| 6,509,283 B1 | 1/2003 | Thomas | |
| 6,524,931 B1 * | 2/2003 | Perera | 438/437 |
| 6,528,332 B2 | 3/2003 | Mahanpour et al. | |
| 6,544,900 B2 | 4/2003 | Raaijmakers et al. | |
| 6,548,416 B2 | 4/2003 | Han et al. | |
| 6,548,899 B2 | 4/2003 | Ross | |
| 6,559,026 B1 | 5/2003 | Rossman et al. | |
| 6,566,278 B1 | 5/2003 | Harvey et al. | |
| 6,583,063 B1 | 6/2003 | Khan et al. | |
| 6,589,868 B2 | 7/2003 | Rossman | |
| 6,596,654 B1 | 7/2003 | Bayman et al. | |
| 6,599,839 B1 | 7/2003 | Gabriel et al. | |
| 6,602,806 B1 | 8/2003 | Xia et al. | |
| 6,614,181 B1 | 9/2003 | Harvey et al. | |
| 6,624,064 B1 | 9/2003 | Sahin et al. | |
| 6,630,413 B2 | 10/2003 | Todd | |
| 6,645,303 B2 | 11/2003 | Frankel et al. | |
| 6,660,391 B1 | 12/2003 | Rose et al. | |
| 6,667,553 B2 | 12/2003 | Cerny et al. | |
| 6,670,284 B2 | 12/2003 | Yin | |
| 6,676,751 B2 | 1/2004 | Solomon et al. | |
| 6,683,364 B2 * | 1/2004 | Oh et al. | 257/510 |
| 6,716,770 B2 | 4/2004 | O'Neill et al. | |
| 6,756,085 B2 | 6/2004 | Waldfried et al. | |
| 6,762,126 B2 | 7/2004 | Cho et al. | |
| 6,787,191 B2 | 9/2004 | Hanahata et al. | |
| 6,794,290 B1 | 9/2004 | Papasouliotis et al. | |
| 6,818,517 B1 | 11/2004 | Maes | |
| 6,819,886 B2 | 11/2004 | Runkowske et al. | |
| 6,830,624 B2 | 12/2004 | Janakiraman et al. | |
| 6,833,052 B2 | 12/2004 | Li et al. | |
| 6,833,322 B2 | 12/2004 | Anderson et al. | |
| 6,835,278 B2 | 12/2004 | Selbrede et al. | |
| 6,858,523 B2 | 2/2005 | Deboer et al. | |
| 6,858,533 B2 | 2/2005 | Chu et al. | |
| 6,867,086 B1 | 3/2005 | Chen et al. | |
| 6,872,323 B1 | 3/2005 | Entley et al. | |
| 6,890,403 B2 | 5/2005 | Cheung | |
| 6,900,067 B2 | 5/2005 | Kobayashi et al. | |
| 6,955,836 B2 | 10/2005 | Kumagai et al. | |
| 6,958,112 B2 * | 10/2005 | Karim et al. | 204/192.3 |
| 7,018,902 B2 | 3/2006 | Visokay et al. | |
| 7,077,904 B2 | 7/2006 | Cho et al. | |
| 7,084,076 B2 | 8/2006 | Park et al. | |
| 7,109,114 B2 | 9/2006 | Chen et al. | |
| 7,115,419 B2 | 10/2006 | Suzuki | |
| 7,122,222 B2 | 10/2006 | Xiao et al. | |
| 7,129,185 B2 | 10/2006 | Aoyama et al. | |
| 7,148,155 B1 | 12/2006 | Tarafdar et al. | |
| 7,176,144 B1 | 2/2007 | Wang et al. | |
| 7,183,177 B2 | 2/2007 | Al-Bayati et al. | |
| 7,192,626 B2 | 3/2007 | Dussarrat et al. | |
| 7,205,248 B2 | 4/2007 | Li et al. | |
| 7,220,461 B2 | 5/2007 | Hasebe et al. | |
| 7,297,608 B1 | 11/2007 | Papasouliotis et al. | |
| 7,335,609 B2 | 2/2008 | Ingle et al. | |
| 7,399,388 B2 | 7/2008 | Moghadam et al. | |
| 7,419,903 B2 | 9/2008 | Haukka et al. | |
| 7,435,661 B2 * | 10/2008 | Miller et al. | 438/424 |
| 7,456,116 B2 | 11/2008 | Ingle et al. | |
| 7,498,273 B2 | 3/2009 | Mallick et al. | |
| 7,524,735 B1 | 4/2009 | Gauri et al. | |
| 7,524,750 B2 | 4/2009 | Nemani et al. | |
| 7,541,297 B2 | 6/2009 | Mallick et al. | |
| 7,745,352 B2 | 6/2010 | Mallick et al. | |
| 7,749,574 B2 | 7/2010 | Mahajani et al. | |
| 7,790,634 B2 | 9/2010 | Munro et al. | |
| 7,803,722 B2 | 9/2010 | Liang | |
| 7,825,038 B2 | 11/2010 | Ingle et al. | |
| 7,825,044 B2 | 11/2010 | Mallick et al. | |
| 7,867,923 B2 | 1/2011 | Mallick et al. | |
| 7,902,080 B2 | 3/2011 | Chen et al. | |
| 7,935,643 B2 | 5/2011 | Liang et al. | |
| 7,943,531 B2 | 5/2011 | Nemani et al. | |
| 7,989,365 B2 | 8/2011 | Park et al. | |
| 7,994,019 B1 | 8/2011 | Kweskin et al. | |
| 2001/0021595 A1 | 9/2001 | Jang et al. | |
| 2001/0029114 A1 | 10/2001 | Vulpio et al. | |
| 2001/0038919 A1 | 11/2001 | Berry et al. | |
| 2001/0042511 A1 | 11/2001 | Liu et al. | |
| 2001/0054387 A1 | 12/2001 | Frankel et al. | |
| 2001/0055889 A1 | 12/2001 | Iyer | |
| 2002/0048969 A1 | 4/2002 | Suzuki et al. | |
| 2002/0068416 A1 | 6/2002 | Hsieh et al. | |
| 2002/0079523 A1 | 6/2002 | Zheng et al. | |
| 2002/0081817 A1 | 6/2002 | Bhakta et al. | |
| 2002/0127350 A1 | 9/2002 | Ishikawa et al. | |
| 2002/0142585 A1 | 10/2002 | Mandal | |
| 2002/0146879 A1 | 10/2002 | Fu et al. | |
| 2002/0164891 A1 | 11/2002 | Gates et al. | |
| 2003/0023113 A1 | 1/2003 | Druzkowski et al. | |
| 2003/0040199 A1 | 2/2003 | Agarwal | |
| 2003/0064154 A1 | 4/2003 | Laxman et al. | |
| 2003/0113992 A1 | 6/2003 | Yau et al. | |
| 2003/0118748 A1 | 6/2003 | Kumagai et al. | |
| 2003/0124873 A1 | 7/2003 | Xing et al. | |
| 2003/0143841 A1 | 7/2003 | Yang et al. | |
| 2003/0159656 A1 | 8/2003 | Tan et al. | |
| 2003/0172872 A1 | 9/2003 | Thakur et al. | |
| 2003/0199151 A1 | 10/2003 | Ho et al. | |
| 2003/0232495 A1 | 12/2003 | Moghadam et al. | |
| 2004/0008334 A1 | 1/2004 | Sreenivasan et al. | |
| 2004/0020601 A1 | 2/2004 | Zhao et al. | |
| 2004/0029352 A1 | 2/2004 | Beyer et al. | |
| 2004/0029353 A1 | 2/2004 | Zheng et al. | |
| 2004/0048492 A1 | 3/2004 | Ishikawa et al. | |
| 2004/0065253 A1 | 4/2004 | Tois et al. | |
| 2004/0079118 A1 | 4/2004 | M'Saad et al. | |
| 2004/0139983 A1 | 7/2004 | Lakshmanan et al. | |
| 2004/0146661 A1 | 7/2004 | Kapoor et al. | |
| 2004/0152342 A1 | 8/2004 | Li et al. | |
| 2004/0161899 A1 | 8/2004 | Luo et al. | |
| 2004/0175501 A1 | 9/2004 | Lukas et al. | |
| 2004/0180557 A1 | 9/2004 | Park et al. | |
| 2004/0185641 A1 | 9/2004 | Tanabe et al. | |
| 2004/0216844 A1 | 11/2004 | Janakiraman et al. | |
| 2004/0219780 A1 | 11/2004 | Ohuchi | |
| 2004/0231590 A1 | 11/2004 | Ovshinsky | |
| 2004/0241342 A1 * | 12/2004 | Karim et al. | 427/585 |
| 2005/0001556 A1 | 1/2005 | Hoffman et al. | |
| 2005/0019494 A1 * | 1/2005 | Moghadam et al. | 427/255.32 |
| 2005/0026443 A1 | 2/2005 | Goo et al. | |
| 2005/0062165 A1 | 3/2005 | Saenger et al. | |

| | | |
|---|---|---|
| 2005/0087140 A1 | 4/2005 | Yuda et al. |
| 2005/0118794 A1 | 6/2005 | Babayan et al. |
| 2005/0142895 A1 | 6/2005 | Ingle et al. |
| 2005/0153574 A1 | 7/2005 | Mandal |
| 2005/0181555 A1* | 8/2005 | Haukka et al. ............... 438/232 |
| 2005/0186731 A1 | 8/2005 | Derderian et al. |
| 2005/0186789 A1 | 8/2005 | Agarwal |
| 2005/0196533 A1 | 9/2005 | Hasebe et al. |
| 2005/0227017 A1 | 10/2005 | Senzaki et al. |
| 2005/0227499 A1 | 10/2005 | Park et al. |
| 2005/0250340 A1 | 11/2005 | Chen et al. |
| 2005/0260347 A1 | 11/2005 | Narwankar et al. |
| 2006/0011984 A1 | 1/2006 | Currie |
| 2006/0014399 A1 | 1/2006 | Joe |
| 2006/0030151 A1 | 2/2006 | Ding et al. |
| 2006/0030165 A1 | 2/2006 | Ingle et al. |
| 2006/0046506 A1 | 3/2006 | Fukiage |
| 2006/0055004 A1 | 3/2006 | Gates et al. |
| 2006/0068599 A1* | 3/2006 | Baek et al. ............... 438/758 |
| 2006/0075966 A1 | 4/2006 | Chen et al. |
| 2006/0088985 A1 | 4/2006 | Haverkort et al. |
| 2006/0090694 A1 | 5/2006 | Cho et al. |
| 2006/0096540 A1 | 5/2006 | Choi |
| 2006/0110939 A1 | 5/2006 | Joshi et al. |
| 2006/0110943 A1 | 5/2006 | Swerts et al. |
| 2006/0121394 A1 | 6/2006 | Chi |
| 2006/0162661 A1 | 7/2006 | Jung et al. |
| 2006/0178018 A1 | 8/2006 | Olsen |
| 2006/0223315 A1 | 10/2006 | Yokota et al. |
| 2006/0228903 A1 | 10/2006 | McSwiney et al. |
| 2006/0252240 A1 | 11/2006 | Gschwandtner et al. |
| 2006/0281496 A1 | 12/2006 | Cedraeus |
| 2006/0286776 A1 | 12/2006 | Ranish et al. |
| 2007/0004170 A1 | 1/2007 | Kawasaki et al. |
| 2007/0020392 A1 | 1/2007 | Kobrin et al. |
| 2007/0026689 A1 | 2/2007 | Nakata et al. |
| 2007/0031598 A1 | 2/2007 | Okuyama et al. |
| 2007/0049044 A1 | 3/2007 | Marsh |
| 2007/0077777 A1 | 4/2007 | Gumpher |
| 2007/0092661 A1 | 4/2007 | Ryuzaki et al. |
| 2007/0128864 A1 | 6/2007 | Ma et al. |
| 2007/0134433 A1 | 6/2007 | Dussarrat et al. |
| 2007/0166892 A1 | 7/2007 | Hori |
| 2007/0173073 A1 | 7/2007 | Weber |
| 2007/0181966 A1 | 8/2007 | Watatani et al. |
| 2007/0232071 A1 | 10/2007 | Balseanu et al. |
| 2007/0232082 A1 | 10/2007 | Balseanu et al. |
| 2007/0275569 A1 | 11/2007 | Moghadam et al. |
| 2007/0281106 A1 | 12/2007 | Lubomirsky et al. |
| 2007/0281495 A1 | 12/2007 | Mallick et al. |
| 2007/0281496 A1* | 12/2007 | Ingle et al. ............... 438/778 |
| 2008/0000423 A1 | 1/2008 | Fukiage |
| 2008/0081104 A1 | 4/2008 | Hasebe et al. |
| 2008/0085607 A1 | 4/2008 | Yu et al. |
| 2008/0102223 A1 | 5/2008 | Wagner et al. |
| 2008/0102650 A1 | 5/2008 | Adams et al. |
| 2008/0188087 A1 | 8/2008 | Chen et al. |
| 2008/0206954 A1 | 8/2008 | Choi et al. |
| 2008/0260969 A1 | 10/2008 | Dussarrat et al. |
| 2008/0305648 A1 | 12/2008 | Fukazawa et al. |
| 2008/0318429 A1 | 12/2008 | Ozawa et al. |
| 2009/0035917 A1 | 2/2009 | Ahn et al. |
| 2009/0053901 A1 | 2/2009 | Goto et al. |
| 2009/0061647 A1 | 3/2009 | Mallick et al. |
| 2009/0075490 A1 | 3/2009 | Dussarrat et al. |
| 2009/0095714 A1 | 4/2009 | Chen et al. |
| 2009/0104755 A1 | 4/2009 | Mallick et al. |
| 2009/0104789 A1 | 4/2009 | Mallick et al. |
| 2009/0104790 A1 | 4/2009 | Liang |
| 2009/0104791 A1 | 4/2009 | Nemani et al. |
| 2009/0194809 A1 | 8/2009 | Cho |
| 2009/0203225 A1 | 8/2009 | Gates et al. |
| 2009/0209081 A1 | 8/2009 | Matero et al. |
| 2009/0224374 A1 | 9/2009 | Bhatia et al. |
| 2009/0232985 A1 | 9/2009 | Dussarrat et al. |
| 2009/0277587 A1 | 11/2009 | Lubomirsky et al. |
| 2009/0280650 A1 | 11/2009 | Lubomirsky et al. |
| 2009/0298257 A1 | 12/2009 | Lee et al. |
| 2009/0325391 A1 | 12/2009 | De Vusser et al. |
| 2010/0081293 A1 | 4/2010 | Mallick et al. |
| 2010/0140756 A1 | 6/2010 | Kozasa et al. |
| 2010/0221428 A1 | 9/2010 | Dussarrat |
| 2010/0221925 A1 | 9/2010 | Lee et al. |
| 2011/0014798 A1 | 1/2011 | Mallick et al. |
| 2011/0034035 A1 | 2/2011 | Liang et al. |
| 2011/0034039 A1 | 2/2011 | Liang et al. |
| 2011/0045676 A1 | 2/2011 | Park et al. |
| 2011/0111137 A1 | 5/2011 | Liang et al. |
| 2011/0129616 A1 | 6/2011 | Ingle et al. |
| 2011/0136347 A1 | 6/2011 | Kovarsky et al. |
| 2011/0159213 A1 | 6/2011 | Cai et al. |
| 2011/0159703 A1 | 6/2011 | Liang et al. |
| 2011/0165347 A1 | 7/2011 | Miller et al. |
| 2011/0165781 A1 | 7/2011 | Liang et al. |
| 2011/0217851 A1 | 9/2011 | Liang et al. |
| 2011/0223774 A1 | 9/2011 | Kweskin et al. |

FOREIGN PATENT DOCUMENTS

| | | |
|---|---|---|
| EP | 0892083 A1 | 1/1999 |
| EP | 1717848 A | 11/2006 |
| JP | 01241826 A | 26/1989 |
| JP | 01-235259 A | 9/1989 |
| JP | 07-014826 A | 1/1995 |
| JP | 08-236518 A | 9/1996 |
| JP | 08-288286 A | 11/1996 |
| JP | 09-237785 A | 9/1997 |
| JP | 2008-159824 A | 7/2008 |
| KR | 10-2004-0091978 A | 11/2004 |
| KR | 1020040104533 A | 12/2004 |
| KR | 1020060081350 A | 12/2004 |
| KR | 10-2005-0003758 A | 1/2005 |
| KR | 10-2005-0094183 A | 9/2005 |
| WO | WO 02/077320 A1 | 10/2002 |
| WO | WO 03/066933 A | 8/2003 |
| WO | WO 2005/078784 A | 8/2005 |
| WO | WO 2007/040856 A2 | 4/2007 |
| WO | WO 2007/140376 A | 12/2007 |
| WO | WO 2007/140424 A | 12/2007 |

OTHER PUBLICATIONS

PCT International Search Report and Written Opinion mailed Jan. 6, 2009, International Application No. PCT/US08/82365, 12 pages.

Coltrin, M.E., et al., "Chemistry of AlGaN Particulate Formation," National Nuclear Security Administration Physical, Chemical, & Nano Sciences Center, Research Briefs, 2005, pp. 42-43.

Kang, Hun, "A Study of the Nucleation and Formation of Multi-functional Nanostructures using GaN-Based Materials for Device Applications," Georgia Institute of Technology, Doctor of Philosophy in the School of Electrical & Comptuer Engineering Dessertation, Deb. 2006, p. 14.

PCT International Search Report and Written Opinion mailed on Jul. 30, 2008 by the European Patent Office, International Application No. PCT/US2007/081139, 19 pages.

EP Search Report mailed Jun. 9, 2009; Application No. 08167338.6, 9 pages.

Tsu, D. V. et al., "Silicon Nitride and Silicon Diimide Grown by Remote Plasma Enhanced Chemical Vapor Deposition", Journal of Vacuum Science and Technology: Part A, AVS/AIP, Melville, NY.; US, vol. 4, No. 3, Part 01, May 1, 1986, pp. 480-485.

Lee, Eun Gu, et al., "Effects of Wet Oxidation on the Electrical Properties of sub-10 nm thick silicon nitride films", Thin Solid Films, Elsevier-Sequoia S.A. Lausanne, CH. vol. 205, No. 2, Dec. 1, 1991, pp. 246-251.

Lucovsky, G. et al., "Deposition of silicon dioxide and silicon nitride by remote plasma enhanced chemical vapor deposition," Journal of Vacuum Science & Technology, vol. 4, No. 3, May-Jun. 1986, pp. 681-688.

PCT International Search Report and Written Opinion mailed Apr. 12, 2010; International Application No. PCT/US2009/055073, 12 pages.

Aylett, B. J. et al., "Silicon-Nitrogen Compounds. Part V. Diphenylamino-derivatives of Silane," J. Chem. Soc. (A), 1969, pp. 636-638.

Aylett, B. J. et al., "Silicon-Nitrogen Compounds. Part VI. The Preparation and Properties of Disilazane," J. Chem. Soc. (A), 1969, pp. 639-642.

Aylett, B. J. et al., "The Preparation and Some Properties of Disilylamine-Correspondence," Inorganic Chemistry, 1966, p. 167.

Beach, David B., "Infrared and Mass Spectroscopic Study of the Reaction of Silyl Iodide and Ammonia. Infrared Spectrum to Silylamine," Inorganic Chemistry, 1992, pp. 4174-4177, vol. 31 No. 20.

Burg, Anton B. et al., "Silyl-Amino Boron Compounds," J. Amer. Chem. Soc., Jul. 1950, pp. 3103-3107, vol. 72.

Davison, A et al., "The Raman Spectra of Manganese and Rhenium Carbonyl Hydrides and Some Related Species," Inorganic Chemistry, Apr. 1967, pp. 845-847, vol. 6 No. 4.

Dussarrat, C. et al., "Low Pressure Chemical Vapor Deposition of Silicon Nitride Using Mono- and Disilylamine," Chemical Vapor Deposition XVI and EUROCVD 14 vol. 2 Proceedings of the International Symposium, Part of the 203rd Electrochemical Society Meeting in Paris France, Apr. 27-May 2, 2003, 11 pages.

Norman, Arlan D. et al., "Reaction of Silylphosphine with Ammonia," Inoragnic Chemistry, 1979, pp. 1594-1597, vol. 18 No. 6.

Sujishi, Sei et al., "Effect of Replacement of Carbon by Silicon in Trimethylamine on the Stabilities of the Trimethylboron Addition Compounds. Estimation of the Resonance Energy for Silicon-Nitrogen Partial Double Bond," Amer. Chem. Soc., Sep. 20, 1954, pp. 4631-4636, vol. 76.

Ward, L. G. L. et al., "The Preparation and Properties of *Bis*-Disilanyl Sulphide and *Tris*-Disilanylamine," J. Inorg. Nucl. Chem., 1961, pp. 287-293, vol. 21, Pergamon Press Ltd., Northern Ireland.

Ward, Laird G. L., "Bromosilane, Iodosilane, and Trisilylamine," Inorganic Syntheses, 1968, pp. 159-170, vol. 11.

Zuckerman, J.J., "Inorganic Reactions and Methods," Formation of Bonds to N, P, As, Sb, Bi (Part 1), ISBN-0-89573-250-5, 1998, 5 pages, vol. 7, VCH Publishers, Inc., New York.

* cited by examiner

DIELECTRIC DEPOSITION AND ETCH BACK PROCESSES FOR BOTTOM UP GAPFILL

CROSS-REFERENCES TO RELATED APPLICATIONS

This application claims the benefit of U.S. Provisional Application No. 60/805,573, filed Jun. 22, 2006, the entire contents of which are herein incorporated by reference for all purposes. This application is also related to U.S. patent application Ser. No. 11/753,918, filed May 25, 2007, and titled "A METHOD FOR DEPOSITING AND CURING LOW-K FILMS FOR GAPFILL AND CONFORMAL FILM APPLICATIONS"; and U.S. patent application Ser. No. 11/753,968, filed May 25, 2007, and titled "A NOVEL DEPOSITION-PLASMA CURE CYCLE PROCESS TO ENHANCE FILM QUALITY OF SILICON DIOXIDE", of which the entire contents of both applications are herein incorporated by reference for all purposes.

BACKGROUND OF THE INVENTION

One of the persistent challenges faced in the development of semiconductor technology is the desire to increase the density of circuit elements and interconnections on substrates without introducing spurious interactions between them. Unwanted interactions are typically prevented by providing gaps or trenches that are filled with electrically insulative material to isolate the elements both physically and electrically. As circuit densities increase, however, the widths of these gaps decrease, increase their aspect ratios and making it progressively more difficult to fill the gaps without leaving voids. The formation of voids when the gap is not filled completely is undesirable because they may adversely affect operation of the completed device, such as by trapping impurities within the insulative material.

Common techniques that are used in such gapfill applications are chemical-vapor deposition ("CVD") techniques. Conventional thermal CVD processes supply reactive gases to the substrate surface where heat-induced chemical reactions take place to produce a desired film. Plasma-enhanced CVD ("PECVD") techniques promote excitation and/or dissociation of the reactant gases by the application of radio-frequency ("RF") energy to a reaction zone near the substrate surface, thereby creating a plasma. The high reactivity of the species in the plasma reduces the energy required for a chemical reaction to take place, and thus lowers the temperature required for such CVD processes when compared with conventional thermal CVD processes. These advantages may be further exploited by high-density-plasma ("HDP") CVD techniques, in which a dense plasma is formed at low vacuum pressures so that the plasma species are even more reactive. While each of these techniques falls broadly under the umbrella of "CVD techniques," each of them has characteristic properties that make them more or less suitable for certain specific applications.

In some instances where gaps have a large aspect ratio and narrow width, gaps have been filled with thermal CVD techniques using a "dep/etch/dep" process by sequentially depositing material, etching some of it back, and depositing additional material. The etching step acts to reshape the partially filled gap, opening it so that more material can be deposited before it closes up and leaves an interior gap. Such dep/etch/dep processes have also been used with PECVD techniques, but some thermal and PECVD techniques are still unable to fill gaps having very large aspect ratios even by cycling deposition and etching steps.

Dep/etch/dep processes have also been shown to improve gapfill in HDP-CVD processes. Originally, the application of dep/etch/dep processes to HDP-CVD was considered counterintuitive because, unlike PECVD processes, the high density of ionic species in the plasma during HDP-CVD processes already causes there to be sputtering of a film while it is being deposited. This simultaneous sputtering and deposition of material during a deposition process tends to keep the gap open during deposition, and was therefore believed to render a separate intermediate etching step superfluous. Nevertheless, in U.S. Pat. No. 6,194,038, filed Mar. 20, 1998 by Kent Rossman, the unexpected result was demonstrated that gapfill could be improved even further by using a dep/etch/dep process under certain HDP-CVD process conditions. This result was later confirmed in U.S. Pat. No. 6,030,181, filed May 5, 1998 by George D. Papasouliotis et al.

However, even for processes that combine HDP-CVD and dep/etch/dep for dielectric gapfills, there are still limits on the size and aspect ratios of the gaps that can be filled. For example, small gaps with high aspect ratios may need to undergo an impractical number dep-etch cycles to keep the top portion of the gap from overfilling with dielectric material. The increased frequency and duration of the etch cycles presents a possibility of damaging the structures that define the gaps to be filled. This possibility exists when insufficient material is deposited during the prior deposition and/or when too much of the deposited material is removed during the etching step. Optimization of a recipe is hindered by the fact that individual chamber characteristics and/or individual wafer characteristics may affect the deposition and etching. As the trend towards more densely packed devices continues, it will be desirable to find new methods of depositing dielectric materials into the gaps that can accommodate their increasing aspect ratios.

BRIEF SUMMARY OF THE INVENTION

Embodiments of the invention include methods to reduce film cracking in a dielectric layer. The methods may include the steps of depositing a first dielectric film on a substrate and removing a top portion of the first dielectric film by performing an etch on the film. The methods may also include depositing a second dielectric film over the etched first film, and removing a top portion of the second dielectric film. In addition, the methods may include annealing the first and second dielectric films to form the dielectric layer, where the removal of the top portions from the first and the second dielectric films reduces a stress level in the dielectric layer.

Embodiments also include methods filling a trench with a dielectric material. The methods may include filling the trench with a film of the dielectric material, where the dielectric film may be formed by combining a first fluid stream comprising atomic oxygen with a second fluid stream comprising a silicon-containing precursor, and reacting the atomic oxygen and the silicon-containing precursor to form the dielectric film in the trench. The methods may also include removing a top portion of the dielectric film by etching the film, and annealing the etched film.

Embodiments still further include additional methods to reduce film cracking in a dielectric layer. The methods may include depositing a first dielectric film on a substrate and performing a first anneal on the first film. The methods may also include removing a top portion of the annealed first film by performing a first etch on the first film, and depositing a second dielectric film over the etched first film. In addition, the methods may include removing a top portion of the second dielectric film by performing a second etch on the second film, and performing a second anneal of the first and second dielectric films and forming the dielectric layer. The removal of the top portions from the first and the second dielectric films reduces a stress level in the dielectric layer.

Embodiments may yet still further include multistep deposition methods for filling a gap on a semiconductor substrate with dielectric material. The methods may include depositing a first dielectric film in a bottom portion of the gap, and annealing the first dielectric film in a first anneal. The methods may further include depositing a second dielectric film on the annealed first dielectric film, and annealing the second dielectric film in a second anneal.

Additional embodiments and features are set forth in part in the description that follows, and in part will become apparent to those skilled in the art upon examination of the specification or may be learned by the practice of the invention. The features and advantages of the invention may be realized and attained by means of the instrumentalities, combinations, and methods described in the specification.

DETAILED DESCRIPTION OF THE INVENTION

Embodiments of the invention include methods and systems for depositing dielectric materials in gaps and trenches within a surface of a substrate. The dielectric materials include silicon oxide films, which have wide application in the art, but the invention is not limited to any particular film composition, as will be evident from the description. Dielectric films deposited according to the techniques of the invention have excellent gapfill properties and can fill high-aspect-ratio gaps encountered in, for example, shallow trench isolation (STI) structures. Dielectric materials deposited by the methods and systems of the invention are particularly useful in filling gaps in 100-nm or smaller technology (e.g., 65 nm, 45 nm technology, etc.).

Dielectric depositions may include the formation of flowable dielectrics on the substrate that tend to collect in the bottom portion of a substrate gap or trench during the deposition. Because the flowable dielectric tends to migrate from the top to bottom portions of a gap, the congestion of dielectric material around the top of the gap is reduced, which reduces the occurrence of voids around the center of the gapfill.

Following a partial or complete fill of the gap, the flowable dielectric may be treated (e.g., cured, baked, annealed, etched, etc.) to harden the dielectric. These treatments often reduce the amount of hydroxyl groups and water vapor in the flowable dielectric, and physically reduce the dimensions of the deposited film, thereby increasing its density. However, when the film shrinks, it is common for cracks (e.g., microcracks) to form that can adversely impact the dielectric qualities, barrier qualities, support qualities, etc., of the deposited dielectric. The size and number of these cracks typically increase with an increased thickness of the deposited dielectric film.

Figure 1A:
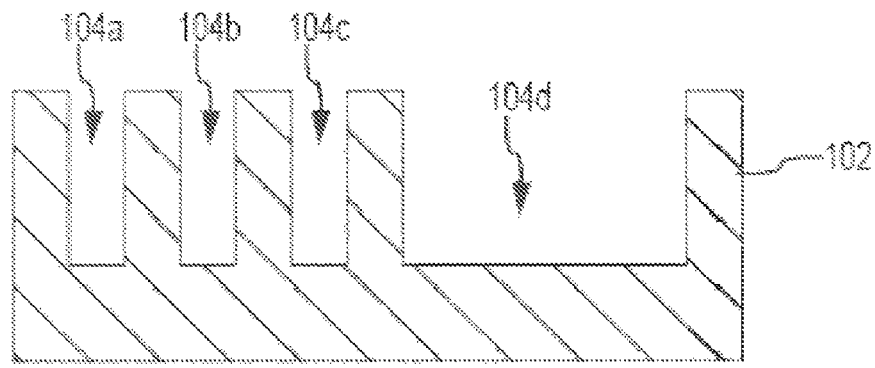
FIGS. 1A-C show cross-sectional views of a gap pattern in a substrate that is filled with dielectric material according to embodiments of the invention.
Figure 1B:
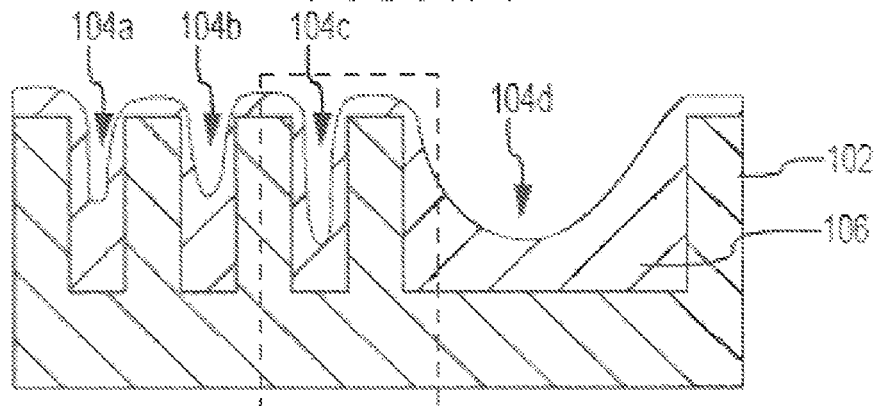
Figure 1C:
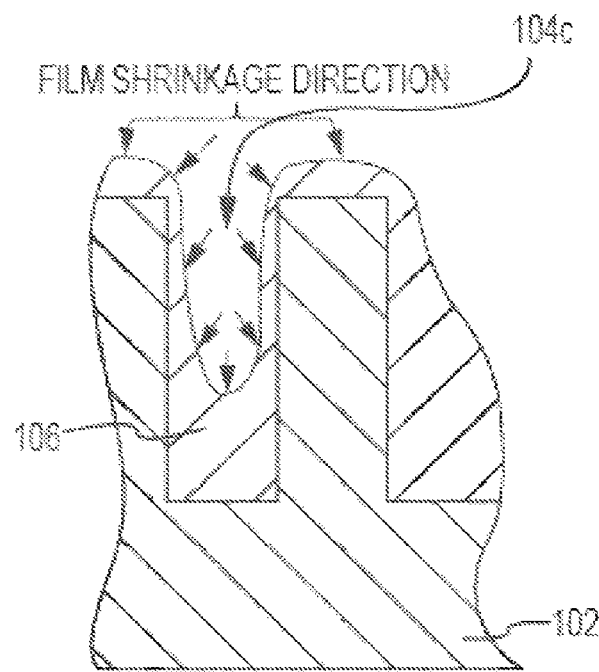

FIGS. 1A-C show cross-sections of a gap pattern formed in a substrate 102 as a flowable dielectric is being deposited and treated in the substrate gaps 104a-d. FIG. 1A shows a substrate 102 with a pattern of gaps 104a-d that includes narrow gaps 104a-c and a wide gap 104d. The gaps 104a-c may have an aspect ratio of about 3:1 or more, about 5:1 or more, about 8:1 or more, about 10:1 or more, about 12:1 or more, etc. The substrate may be made of a semiconductor material (e.g., Si, doped Si, GaAs, etc.) on which circuit elements (e.g., transistors, contacts, etc.) are formed into an integrated circuit. The substrate may be a semiconductor substrate wafer (e.g., a 100 mm, 150 mm, 200 mm, 300 mm, 400 mm, etc., wafer). The substrate 102 may also include one or more additional layers, such as a dielectric layer (e.g., a contact layer, a PMD layer, a IMD layer, etc.) in which the gaps 104a-d have been formed.

FIG. 1B shows the substrate 102 following a deposition of a flowable dielectric material 106. The flowable dielectric may be a silicon oxide type dielectric formed from the reaction of oxygen-containing and silicon-containing precursors. For example, the oxide dielectric may be formed from the reaction of remotely generated radical atomic oxygen (i.e., the oxygen-containing precursor) and an organo-silicon precursor such as tetramethylorthosilicate (i.e., the silicon-containing precursor). Additional details and examples of methods of depositing flowable dielectric compositions may be found in co-assigned U.S. patent application Ser. No. 11/549,930, filed Oct. 16, 2006, and titled "FORMATION OF HIGH QUALITY DIELECTRIC FILMS OF SILICON DIOXIDE FOR STI: USAGE OF DIFFERENT SILOXANE-BASED PRECURSORS FOR HARP II—REMOTE PLASMA ENHANCED DEPOSITION PROCESSES"; and U.S. patent application Ser. No. 11/754,440, filed May 29, 2007, and titled "CHEMICAL VAPOR DEPOSITION OF HIGH QUALITY FLOW-LIKE SILICON DIOXIDE USING A SILICON CONTAINING PRECURSOR AND ATOMIC OXYGEN" of which the entire contents of both applications are herein incorporated by reference for all purposes.

In the example shown, the flowable dielectric 106 partially fills the gaps 104a-d. The flowability of the dielectric may cause a migration from the top to the bottom portions of the gaps 104a-d, which increases the thickness of the film at the bottom portion of the gaps. The rate of the dielectric film migration depends on the film's viscosity as well as process parameters, such as the deposition temperature.

FIG. 1C shows size changes in the dielectric thickness of one of the partially filled gaps 104c during a post-deposition treatment of the dielectric material. As indicated by the arrows, the treatment reduces the thickness of the deposited dielectric material 106 along the bottom and sidewalls of the gap 104c, as well as the material 106 over the top of the gap. The net effect of this shrinkage is to widen the cavity formed in the gap 104c by the sidewalls and bottom portions of the treated dielectric material. As note above, the change in physical dimensions of the treated dielectric can also cause the film to crack.

The film cracking may be reduced or eliminated by etching the film before or during a treatment step that reduces the size and increases the density of the film. For example, and etch may be preformed on the newly deposited film that removes a top portion of the film. This etch may reduce the stresses on the film that can lead to cracking during a subsequent densification step. Following the etch, additional dielectric material may be deposited before or after the treatment of the etched dielectric film. Another etch may be performed on the additional dielectric material.

Figure 2A:
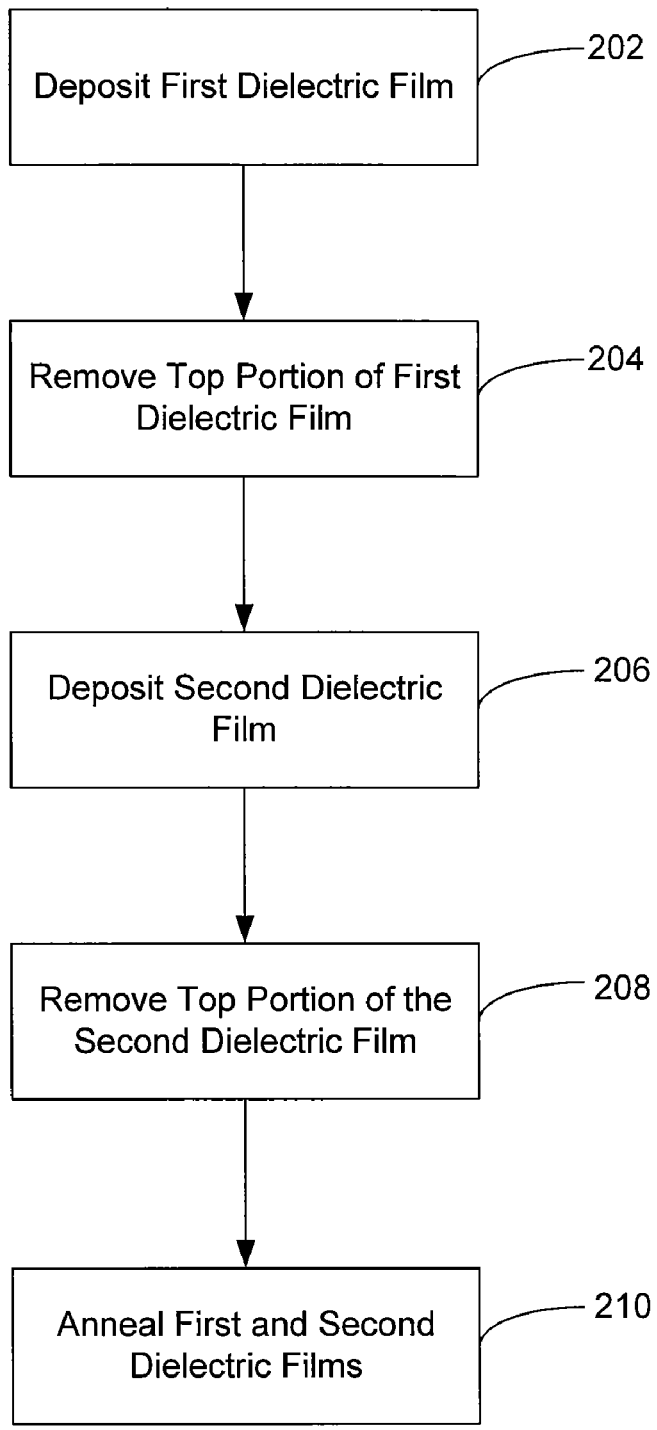
FIGS. 2A&B are flowcharts showing methods of depositing dielectric material on a substrate according to embodiments of the invention.

FIGS. 2A&B are flowcharts showing an exemplary method 200 of depositing and etching dielectric material from a substrate according to embodiments of the invention. The method 200 shown in FIG. 2A includes depositing a first film 202 on the substrate. The film may be a flowable dielectric film deposited on a substrate having one or more gaps and/or trenches that are formed in the substrate.

For example, the deposited first film may include a silicon oxide dielectric formed from an organo-silicon precursor and oxygen-containing precursor. The organo-silicon precursor may include one or more of dimethylsilane, trimethylsilane, tetramethylsilane, diethylsilane, trimethoxysilane (TriMOS), tetramethylorthosilicate (TMOS), triethoxysilane (TriEOS), tetraethylorthosilicate (TEOS), octamethyltrisiloxane (OMTS), octamethylcyclotetrasiloxane (OMCTS), tetramethylcyclotetrasiloxane (TOMCATS), DMDMOS, DEMS, methyl triethoxysilane (MTES), phenyldimethylsilane, and/or phenylsilane. The oxygen-containing precursor may be atomic oxygen that is generated remotely from oxygen containing species such as molecular oxygen ($O_2$), ozone ($O_3$), nitrogen dioxide ($NO_2$), nitrous oxide ($N_2O$), peroxide (e.g., $H_2O_2$) and water vapor ($H_2O$), among other oxygen containing species. Additional gases may also be present with the precursors, such as carrier gases (e.g., hydrogen, helium, nitrogen (N2), argon, etc.) that help transport the precursors to a deposition chamber, and water vapor, peroxide and/or other hydroxyl-containing species introduced into the deposition chamber.

In some examples of method 200, the deposited first film may completely fill the gaps, and may even continue to a final thickness above the gaps. In additional examples, the first film may partially fill the gaps (e.g., fill the bottom 10%, 20%, 30%, 40%, 50%, 60%, 70, 80%, or 90%, etc., of the gap).

Following the deposition 202, a top portion of the first dielectric film may be removed 204. The removal may be done by etching the freshly deposited film. For example, the film may be chemically dry etched with an activated etchant such as atomic fluorine. The activated fluorine may be generated from one or more fluorine containing precursors (such as NF3 and/or an organo-fluorine compound) that is dissociated in a plasma. Etchants may also include oxygen, ozone, and/or hydrogen gas. In additional examples, the film may be plasma etched by exposure to a plasma of helium, argon, nitrogen, etc. generated by, for example, a remote plasma system or microwave applicator located outside the reaction chamber, and/or and ICP or CCP generator that generates the plasma inside the reaction chamber.

In some examples, the removed top portion of the film may constitute about 10%, 20%, 30%, 40%, 50%, 60%, etc., of the thickness of the film. When the first film is initially deposited at or above the tops of the gaps/trenches, the removal step 204 may remove enough material to bring dielectric level below the tops of the gaps/trenches. In additional instances, the removal step 204 may remove some of the dielectric above the tops, but not enough to bring the dielectric below the tops of the gaps/trenches. When the first film is initially deposited below the tops of the gaps/trenches, the removal step 204 may further reduce the amount of the first film in the trenches.

During or following the removal 204, the first film may, in some embodiments, be treated to harden and increase the density of the film. The treatments may include baking (i.e., thermal annealing), irradiative annealing, plasma curing, E-beam curing, and/or UV curing the film, among other treatments. For example, the film may be baked (i.e., thermally annealed) at a temperature of up to about 600° C. (e.g., about 300° C. to about 400° C.) for a period of time of up to about an hour (e.g., about 1 minute to about 1 hour). In irradiative annealing, the film may be exposed to thermal radiation (e.g., infrared radiation) from, for example, heat lamps that raise the temperature of the film. An example of irradiative annealing is rapid thermal annealling (RTA). Plasma curing and E-beam curing may be done by exposing the film to a plasma and electron-beam, respectively. The plasma may be a induced-coupled plasma (ICP) or capacitively-coupled plasma (CCP) that is generated inside the chamber containing the substrate. UV curing may be done by exposing the film to radiation having a significant UV frequency component. The radiation may be generated by, for example, an incandescent light source and/or a laser.

After the removal of a top portion of the first dielectric film 204, and in some embodiments a treatment of the first dielectric film, a second dielectric film may be deposited 206 on a remaining portion of the first film. The second dielectric film may be deposited with using the same precursors and deposition conditions as the first dielectric film. For example, the first and second dielectric films may be silicon oxide films deposited using the same organo-silicon and oxygen-containing precursors. In additional embodiments, the second film may use different precursors or process conditions than the first film, and may be a different kind of dielectric than the first film (e.g., a silicon nitride or silicon oxy-nitride dielectric instead of a silicon oxide dielectric).

The second dielectric film may also be a flowable dielectric. When the remaining portion of the first film is below the tops of the gaps/trenches, the second film may fill the rest of the gaps/trenches, and may continue to fill a space above the tops. In additional examples where the first film is below the tops, the second film may fill a volume that is less than the total remaining volume in the gaps/trenches. In these examples, one or more additional dielectric depositions may be done to completely fill the gaps/trenches.

Similar to the first dielectric film, a top portion of the second dielectric film may be removed 208 following the initial deposition. The removal step 208 may remove the same portion of the film as the first portion, or it may remove a greater or lesser percentage of the film than the first removal step 204. In some instances, the second removal step 208 may be stopped before the second dielectric film dips below the top of the gaps/trenches, while in other instances removal step 208 leaves the remaining second dielectric film below the tops of the gaps/trenches.

The remaining portions of the first and second dielectric films may be annealed 210. The anneal 210 may be a thermal anneal (i.e., baking), a plasma anneal, a ultraviolet light anneal, an IR irradiative anneal (e.g., RTA), an e-beam anneal, and/or a microwave anneal, among other types of anneals. For example, the anneal 210 may be a thermal anneal that includes adjusting the temperature of the substrate to about 300° C. to about 1000° C. (e.g., about 650° C. to about 950° C.) for a period of about 1 minute to about 1 hour. The anneal atmosphere may be, for example, and inert gas atmosphere (e.g., $N_2$, He, Ne, Ar, $H_2$, etc.), and/or an oxygen containing atmosphere $NO_2$, $N_2O$, $H_2O$, $H_2O_2$, $O_2$, $O_3$, etc., among other types of atmospheres. The pressure of the anneal atmosphere may be from about 0.1 Torr to about 100 Torr (e.g., about 1 to 2 Torr). The anneal 210 normally increases the density and reduces the etch rate (e.g., reduces the WERR) of the annealed dielectric material.

Figure 2B:
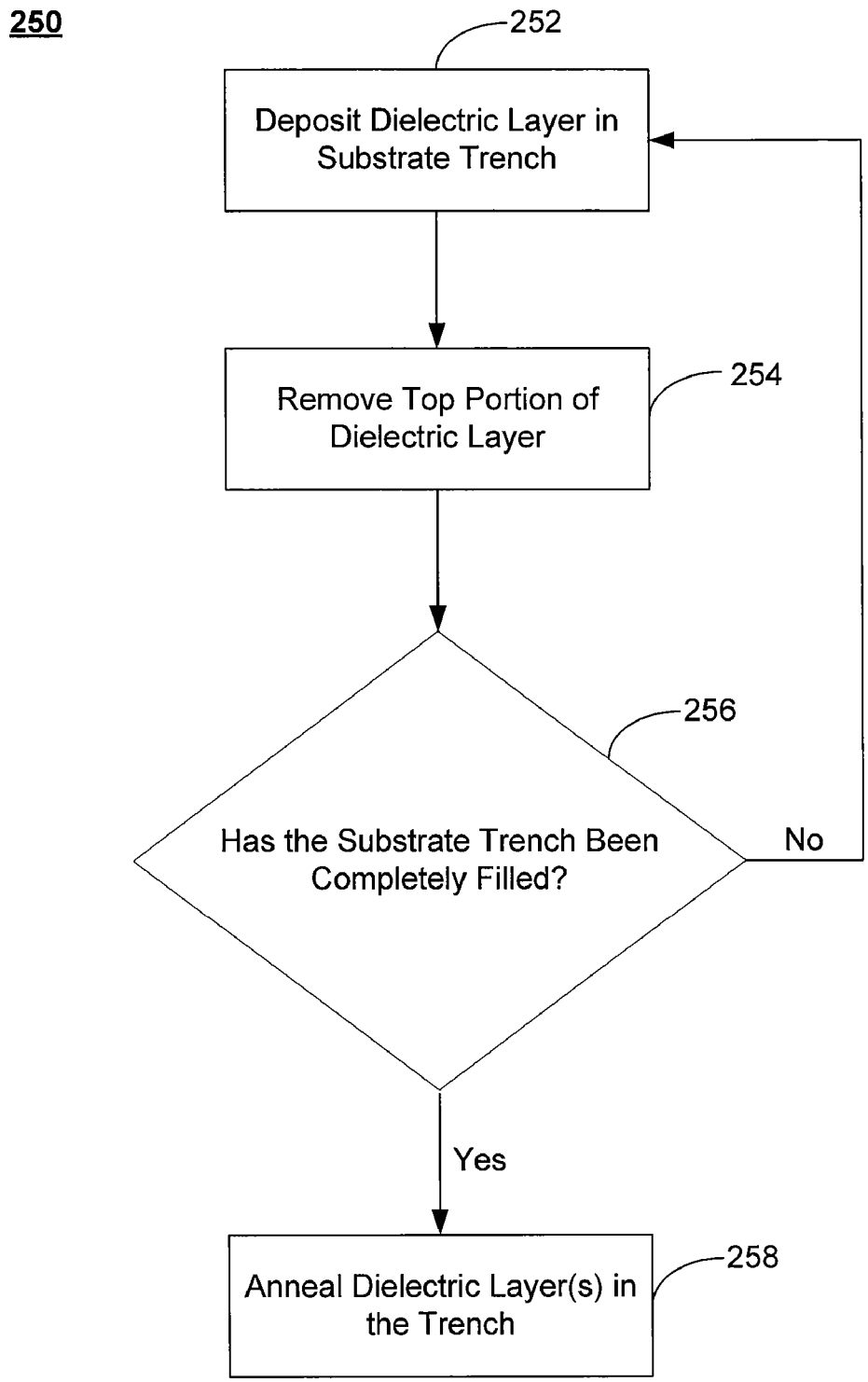

FIG. 2B shows a method 250 of depositing and etching one or more layers of dielectric material in a substrate gap or trench according to embodiments of the invention. The method 250 may include depositing a dielectric layer into the substrate gap/trench 252 and removing a top portion of the deposited dielectric layer 254. A determination is then made whether the deposited and etched dielectric material fills the trench 256 (i.e., whether the dielectric film is at or above the top of the gap). If the dielectric material has not entirely filled the gap, then an additional dielectric layer is deposited and etched in the gap, and another determination is made about whether the gap is completely filled.

When the gap has been completely filled with dielectric after one, two, three, etc. deposition 252 and removal 254 cycles, the layer (or layers) of dielectric may be annealed 258. As noted above, the anneal 258 may be a thermal anneal (i.e., baking), a plasma anneal, a ultraviolet light anneal, an IR irradiative anneal (e.g., RTA), an e-beam anneal, and/or a microwave anneal, among other types of anneals.

Figure 3:
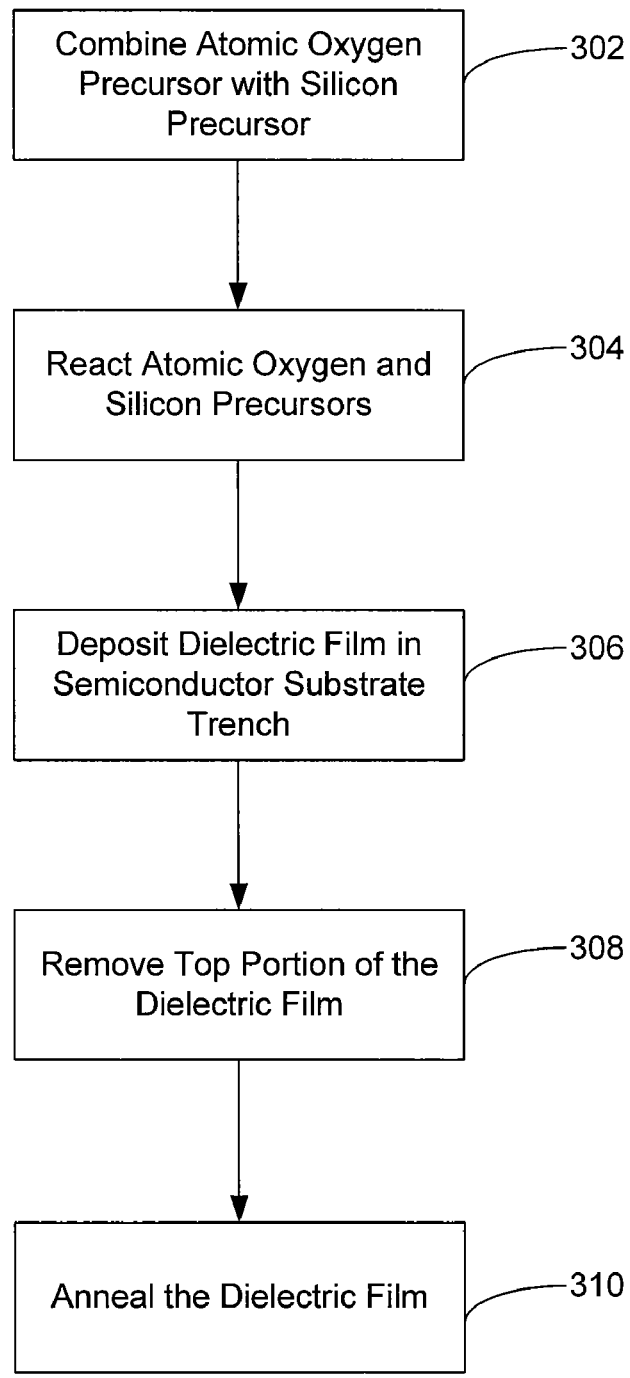
FIG. 3 is a flowchart illustrating methods of depositing dielectric material that includes using an atomic oxygen precursor to deposit the material according to embodiments of the invention.

Referring now to FIG. 3, flowchart illustrating an exemplary method 300 of depositing dielectric material that includes using an atomic oxygen precursor to deposit the material according to embodiments of the invention is shown. The method 300 may include combing an atomic oxygen precursor with a silicon precursor 302 and reacting the precursors 304 to deposit a dielectric film in the gap or trench on a semiconductor substrate. The atomic oxygen may be generated in-situ in the deposition chamber, or remotely generated and transported to the chamber. For example, a remote plasma generation system may be used to dissociate an oxygen-containing precursor (e.g., O2, O3, N2O, NO2, etc.) and form the atomic oxygen species, which is then transported to the deposition chamber to mix and react with other precursors (e.g., silicon-containing precursors) and deposit the dielectric material 306.

Following the deposition 306, a top portion of the dielectric film may be removed in a etch process 308. For example, when the dielectric is primarily silicon dioxide ($SiO_x$), a top portion of the oxide may be removed by exposing the deposited film to activated fluorine (e.g., about 1 second to about 1 minute of exposure) generated by the dissociation (e.g., plasma dissociation) of a fluorine precursor such as $NF_3$ that is transported to the substrate (e.g., $NF_3$ flows into the substrate at about 1500 sccm with a total chamber pressure of about 1 to 2 Torr). The activated fluorine reacts with the silicon oxide to form silicon fluoride compounds (e.g., $SiF_4$) that are volatile and get removed from the deposited dielectric.

The remaining portion of the dielectric after removal step 308 may be annealed 310 to increase the density and reduce the etch rate of the film. The anneal 310 may be a thermal anneal (i.e., baking), a plasma anneal, a ultraviolet light anneal, an IR irradiative anneal (e.g., RTA), an e-beam anneal, and/or a microwave anneal, among other types of anneals.

Figure 4:
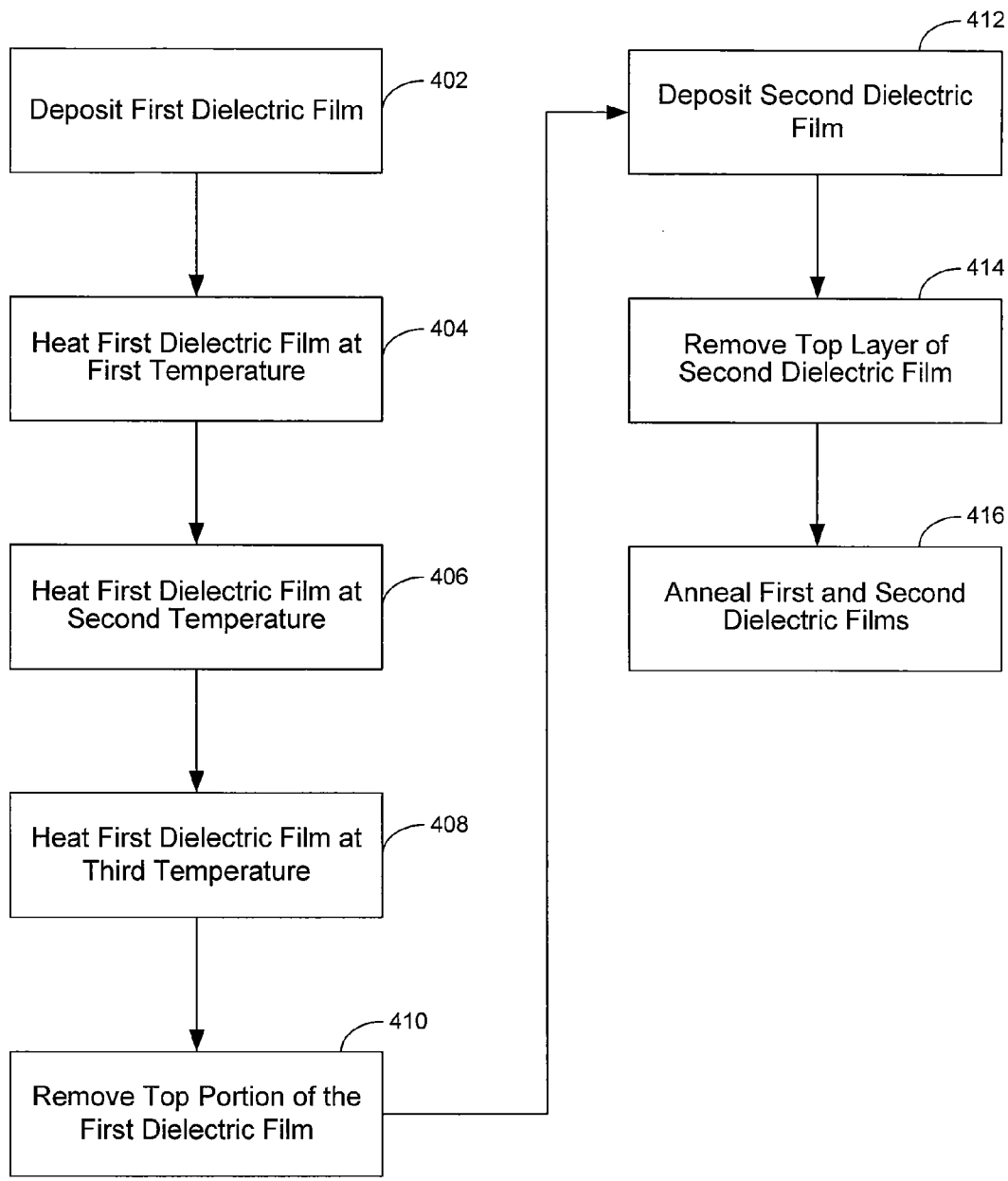
FIG. 4 is a flowchart that shows methods of depositing and heating dielectric material according to embodiments of the invention.

FIG. 4 shows a flowchart illustrating a method 400 of depositing and heating dielectric material according to embodiments of the invention. The method 400 includes a multistep heating process where a first deposited dielectric film is heated in three stages at three different temperatures before a top portion of the film is removed. The method 400 may start with depositing the dielectric film 402 on a substrate that may have one or more gaps and/or trenches. The film my partially or completely fill these gaps.

Following the deposition 402, the film may be heated to a first temperature 404 (e.g., up to about 50° C.) for a first period of time (e.g., about 1 hour). Then the film may be adjusted to a second temperature 406 (e.g., about 50° C. to about 100° C.) for a second period of time (e.g., about 30 minutes). The film may then further be adjusted to a third temperature 408 (e.g., about 100° C. to about 600° C.) for a third period of time (e.g., about 30 minutes to about 1 hour). Additional heating steps (not shown) may also occur.

A top portion of the first dielectric may removed 410 after the multistep heating. This removal may be done by a chemical wet etch or dry etch process. Then, a second dielectric film may be deposited 412 on the remaining portion of the first film and another top portion of the second film may be removed 414.

The remaining portions of the first and second dielectric films may then be annealed 416 to increase the density of the films. The anneal 416 may be done in a dry, non-reactive atmosphere (e.g., $N_2$, He, etc.) at a temperature of about 800° C. or more (e.g., about 850° C., about 900° C., about 950° C., about 1000° C., etc.).

Figure 5A:
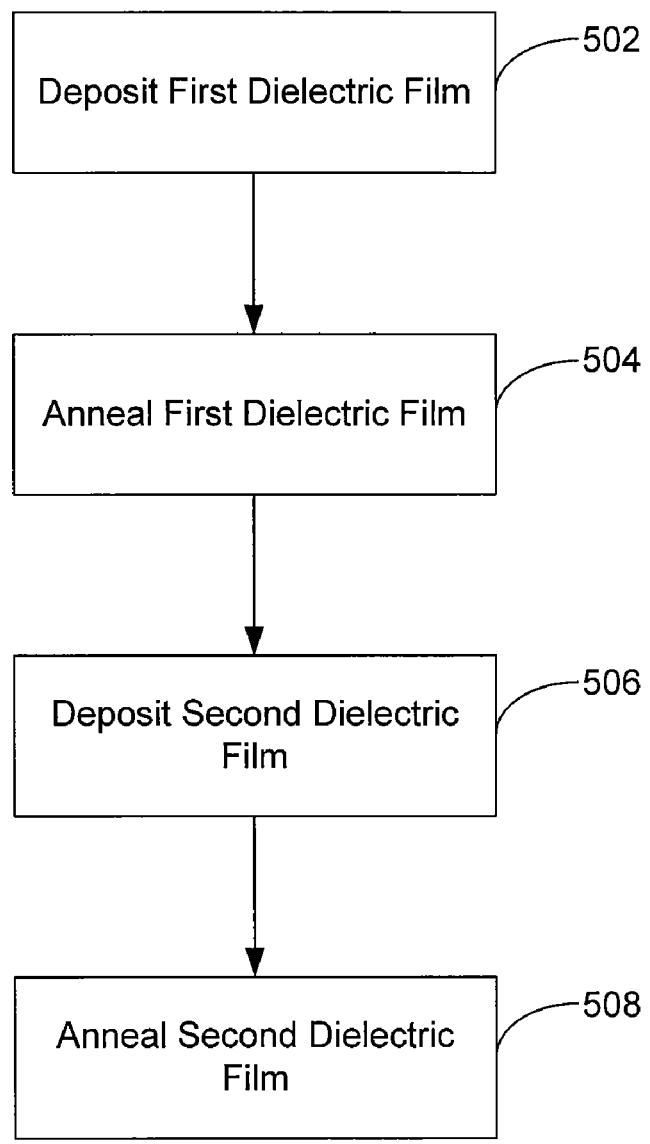
FIGS. 5A&B are additional flowcharts showing methods of depositing and annealing dielectric material according to embodiments of the invention.
Figure 5B:
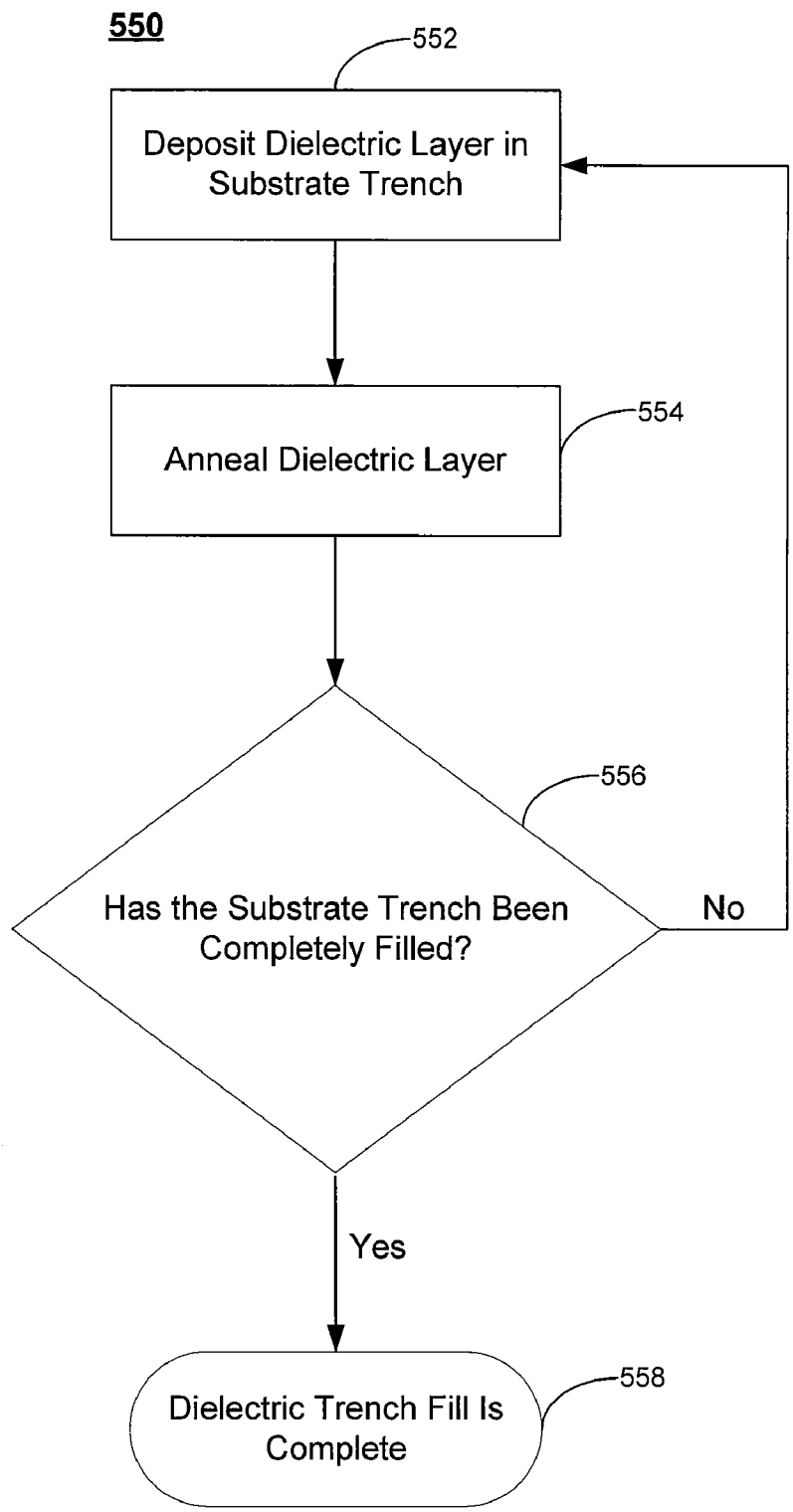

Referring now to FIGS. 5A & 5B additional flowcharts showing methods 500 and 550 of depositing and annealing dielectric material according to embodiments of the invention are shown. FIG. 5A shows a method 500 that includes alternating deposition and annealing cycles that may be done to completely fill a gap or trench formed in a substrate, or constitute the a partial fill. The method 500 may include depositing a first film 502 in a gap and/or trench, and annealing the film 504. A second dielectric film may then be deposited 506 over the first film and the second film may then be annealed 508. The first anneal 504 may be done at a lower temperature (e.g., up to about 600° C.) than the second anneal 508 (e.g., up to a second temperature of about 1000° C.). The method 500 may also include removing a top portion of the first film before or after the anneal 504, and removing a top portion of the second film before or after the anneal 508.

FIG. 5B shows another method 550 of one or more alternating dielectric deposition and anneal cycles that may continue until a gap and/or trench is completely filled with dielectric material. The method 550 may include depositing a dielectric layer 552 in a trench formed in a substrate and annealing the dielectric layer 554. Following the first deposition and annealing cycle, a determination may be made about whether the trench is completely filled by the dielectric 556. If the trench has been completely filled, then the trench filling is complete 558 and no more dep-anneal cycles are run. If the trench is not completely filled, then at least one more deposition 552 and anneal 554 cycle is run to further fill the trench with dielectric material.

Figure 6A:
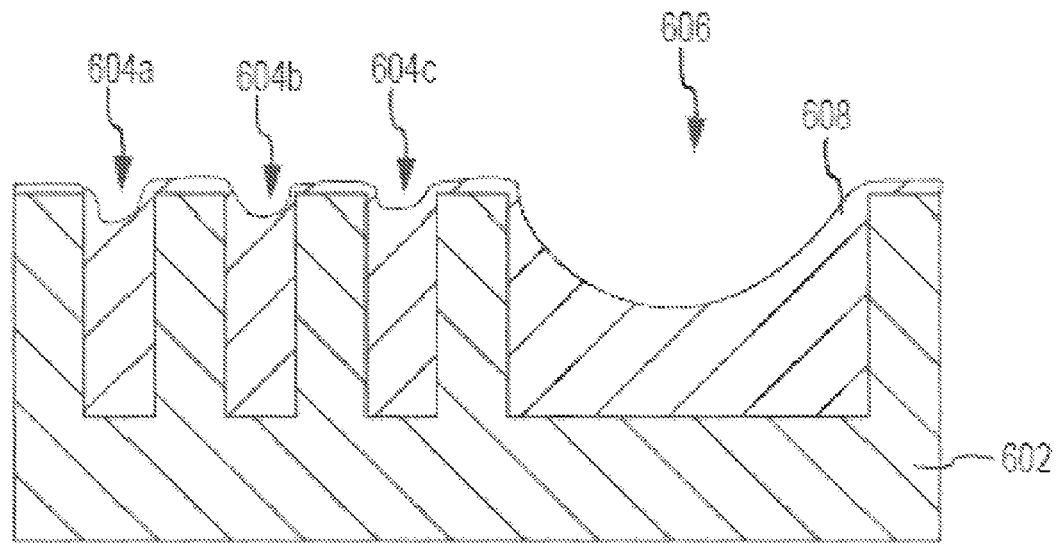
FIGS. 6A-D show cross-sectional views of substrate gaps that are filled with dielectric material according to embodiments of the invention.

FIGS. 6A-D show cross-sectional views of substrate gaps that are successively filled with two layers of dielectric material according to embodiments of the invention. FIG. 6A shows a portion of a substrate 602 in which gaps 604a-c and trench 606 have been formed. As noted above, the substrate 602 may be made from a semiconductor material such a silicon, and may be a circular silicon substrate wafer having a diameter of about 100 mm, 150 mm, 200 mm, 300 mm, 400 mm, etc. A first dielectric film 608 partially fills the gaps 604a-c and trench 606. The dielectric film 608 may be a flowable dielectric of silicon oxide, nitride, carbon-containing oxide, or oxy-nitride, among other dielectric materials.

Figure 6B:
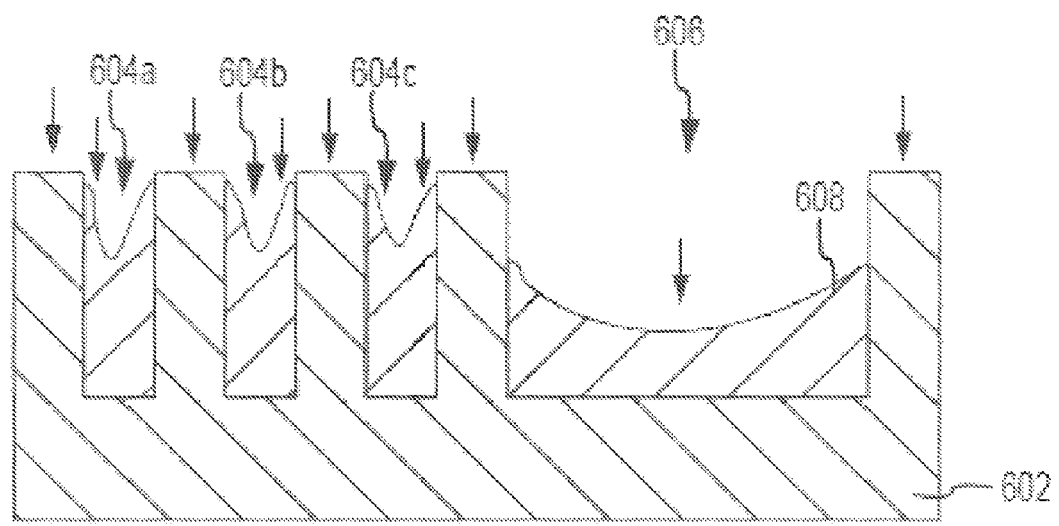

FIG. 6B shows the remaining first dielectric film 608 in the gaps 604a-c and trench 606 following the removal of a top portion of the film. In the example shown, the removal step etched back all the film 608 above the top of the gaps and trench, and recessed the film in the gaps and trench. Following the removal of the top portion, a treatment step may be performed on the remaining film 608 to increase its density and/or hardness before depositing a subsequent layer.

Figure 6C:
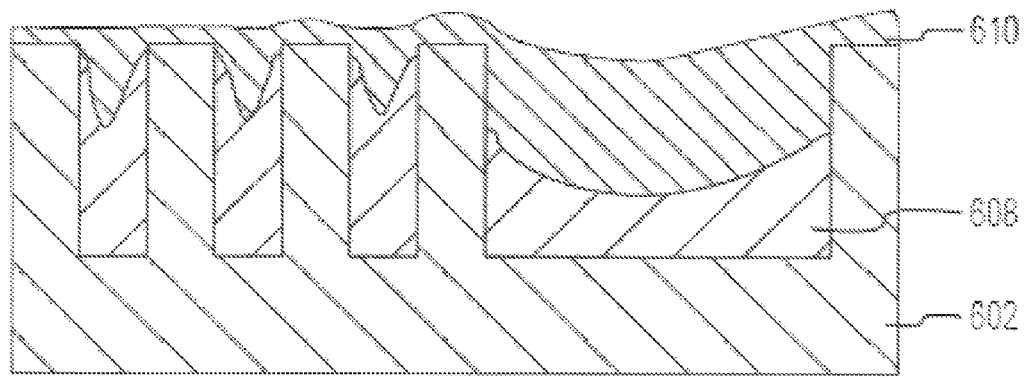

FIG. 6C shows the deposition of a second dielectric layer 610 on the remaining portion of the first dielectric layer 608. The second dielectric layer 610 completely fills the gaps 604a-c and trench 606 with dielectric, and further extends above the tops of the gaps and trench. The second dielectric layer 610 may also be made from a flowable dielectric material, and may have the same composition as the first dielectric layer 608.

Figure 6D:
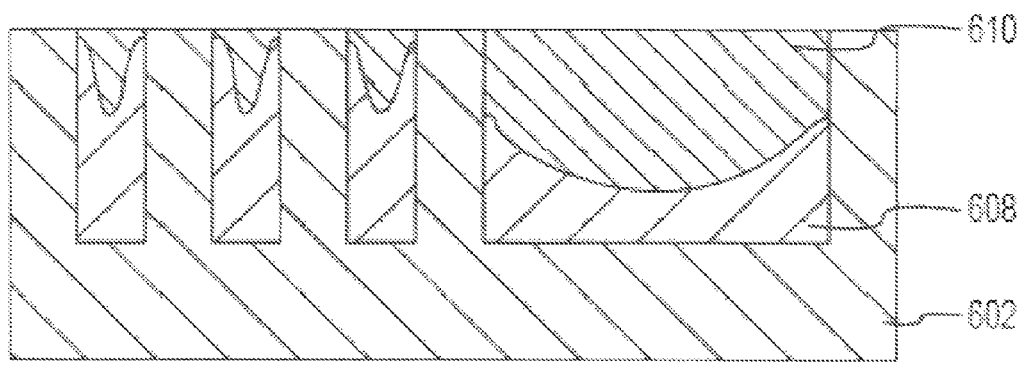

A top portion of the second dielectric film 608 may be removed to form a planarized dielectric gapfill in the gaps 604a-c and trench 606, as shown in FIG. 6D. The removal of the top portion of the second film 610 may be done using the same process used to remove the top portion of the first film 608. An anneal may be performed on the first and second deposited films before or after the removal of the top portion of the second film 610. The anneal may be a thermal anneal (i.e., baking), a plasma anneal, a ultraviolet light anneal, an IR irradiative anneal (e.g., RTA), an e-beam anneal, and/or a microwave anneal, among other types of anneals.

Figure 7A:
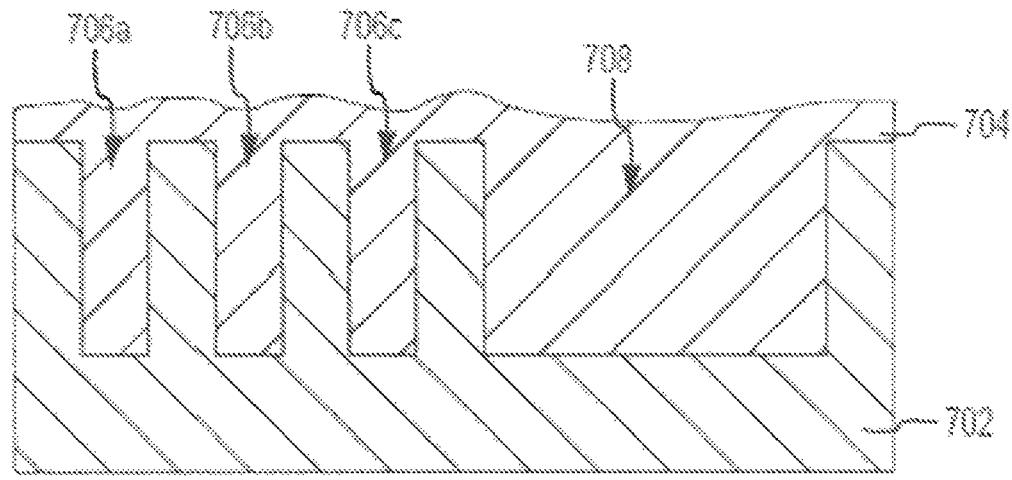
FIGS. 7A-C show additional cross-sectional views of substrate gaps that are filled with dielectric material according to embodiments of the invention.
Figure 7B:
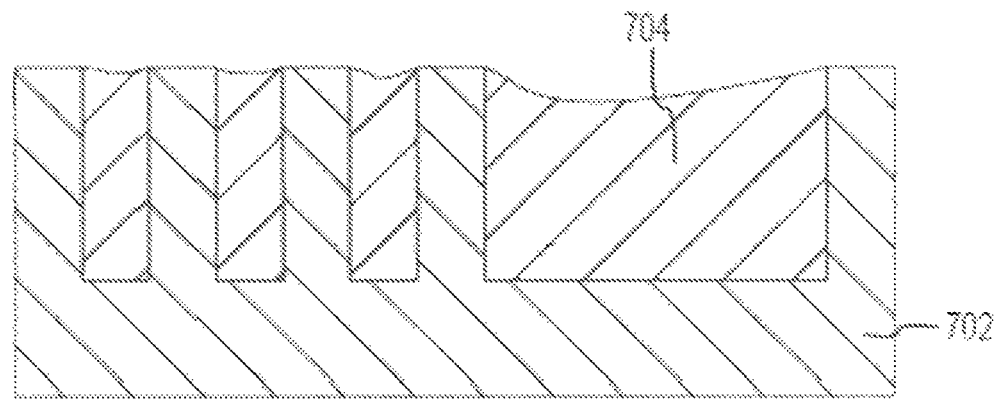
Figure 7C:
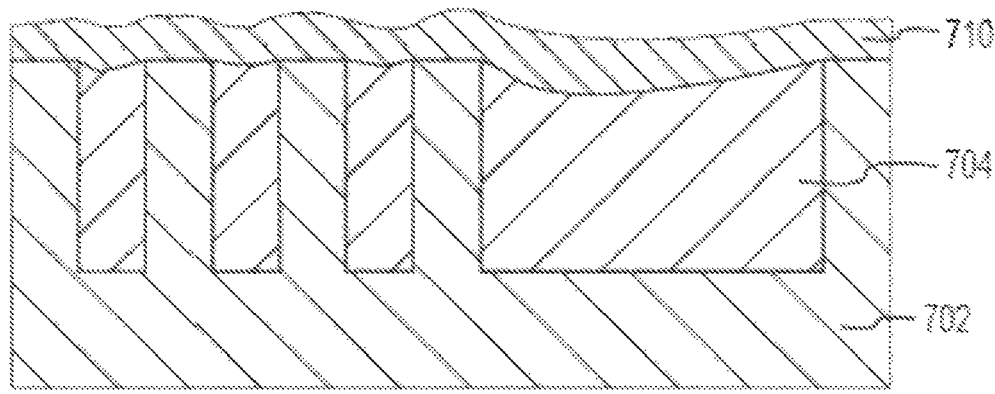

Referring now to FIGS. 7A-C, cross-sectional views of substrate gaps on which a first and second dielectric film are deposited according to embodiments of the invention is shown. In FIG. 7A, a first dielectric film 704 is shown completely filling the gaps 706a-c and trench 708 which are formed in substrate 702. A top portion of the first dielectric is then removed as shown in FIG. 7B. The remaining dielectric 704 may be treated (e.g., annealed) before a second layer of dielectric 710 is deposited on the substrate 702.

The second layer 710 may be a flowable dielectric deposited under the same conditions as the first dielectric layer 704, or it may be deposited by a different deposition method. For example, the second layer 710 may be deposited by a conventional sub-atmospheric chemical vapor deposition process (SACVD), such as HARP, a high-density plasma chemical vapor deposition process (HDP-CVD), or a plasma-enhanced chemical vapor deposition process (PECVD), among other types of processes used to deposit dielectric material. The first and second dielectric layers may then be annealed before or after subsequent processing steps, such as planarizing the top of the dielectric with an etch and/or chemical-mechanical polishing technique.

Experimental

Figure 8A:
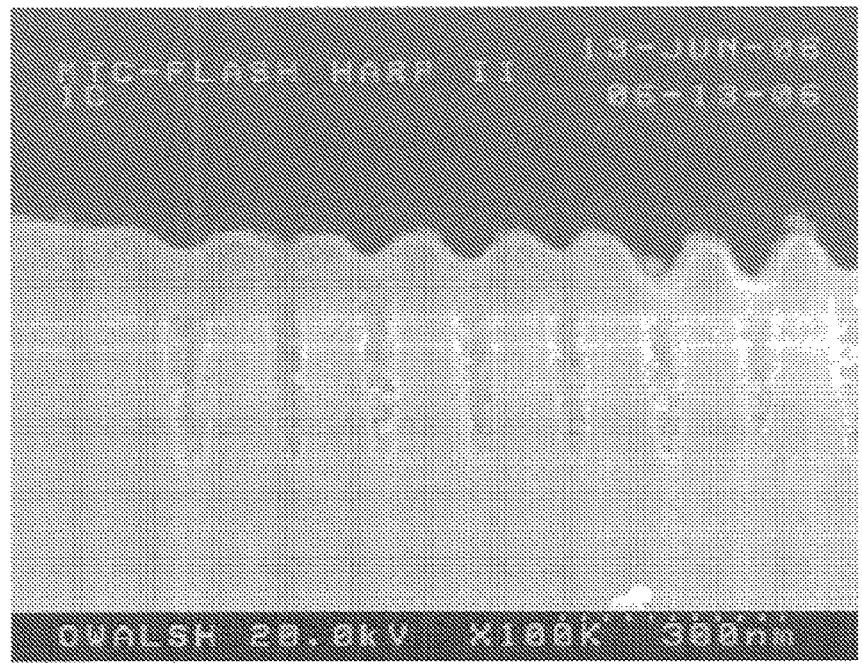
FIGS. 8A&B show electron micrographs of dielectric materials deposited in substrate gaps and along a substrate step according to embodiments of the invention.
Figure 8B:
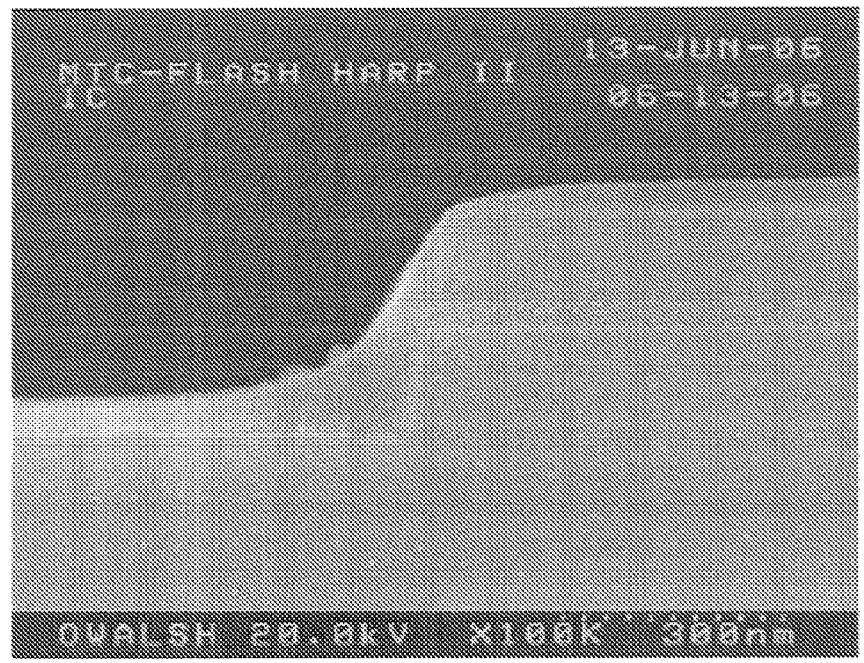

FIGS. 8A&B are electron micrograph images of substrate gaps and a substrate steps following the deposition and etch of a dielectric material according to embodiments of the invention. FIG. 8A shows a series of gaps into which a flowable dielectric film of silicon oxide has been deposited. FIG. 8B shows a step formed in the substrate that is covered with the same flowable oxide film. As both figures show, etching the deposited dielectric before annealing the film eliminates cracking in the final annealed film.

The silicon oxide film was formed by the reaction of atomic oxygen and TMOS. The atomic oxygen was generated from a source of molecular oxygen ($O_2$) and provided to the deposition chamber containing the substrate at a flow rate of about 1400 sccm. The TMOS was provided to the deposition chamber at rate of about 1850 mgm, and the deposition chamber pressure was held at about 1.5 Torr during the deposition. This was a low-temperature oxide deposition with the substrate wafer held at a temperature of about 50° C.

Following the deposition, the silicon oxide was etched in a dry chemical etch process using activated fluorine. The precursor to the activated fluorine was $NF_3$, which flowed at a rate of 1500 sccm into the chamber holding the substrate. As the total chamber pressure was maintained at about 1.6 Torr, the $NF_3$ was plasma dissociated and the substrate was exposed to the activated fluorine for about 10 seconds. Then the etched substrate was annealed at about 400° C. in an atmosphere that included ozone.

Figure 9A:
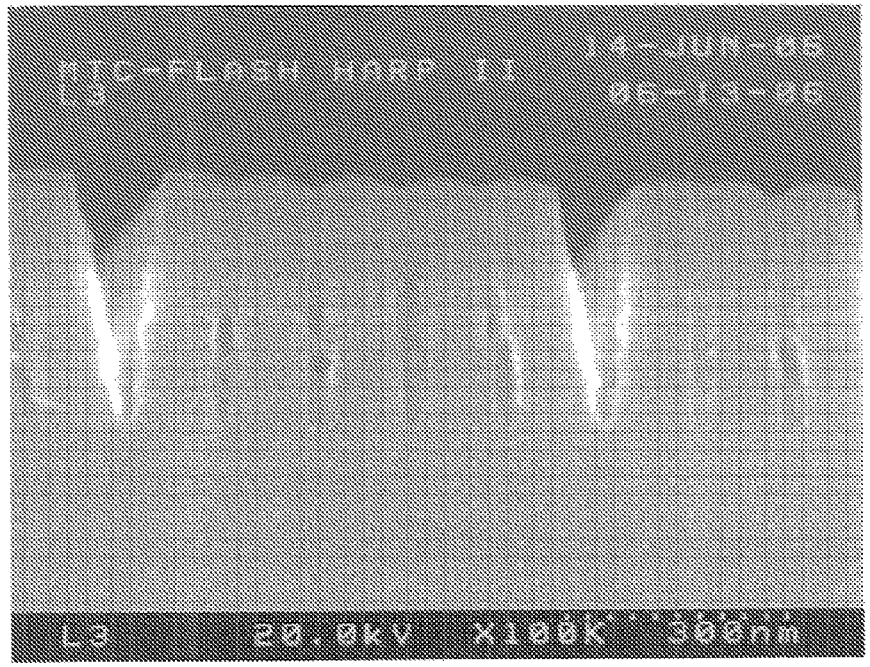
FIGS. 9A&B show electron micrographs of comparative dielectric depositions in substrate gaps and along a substrate step.
Figure 9B:
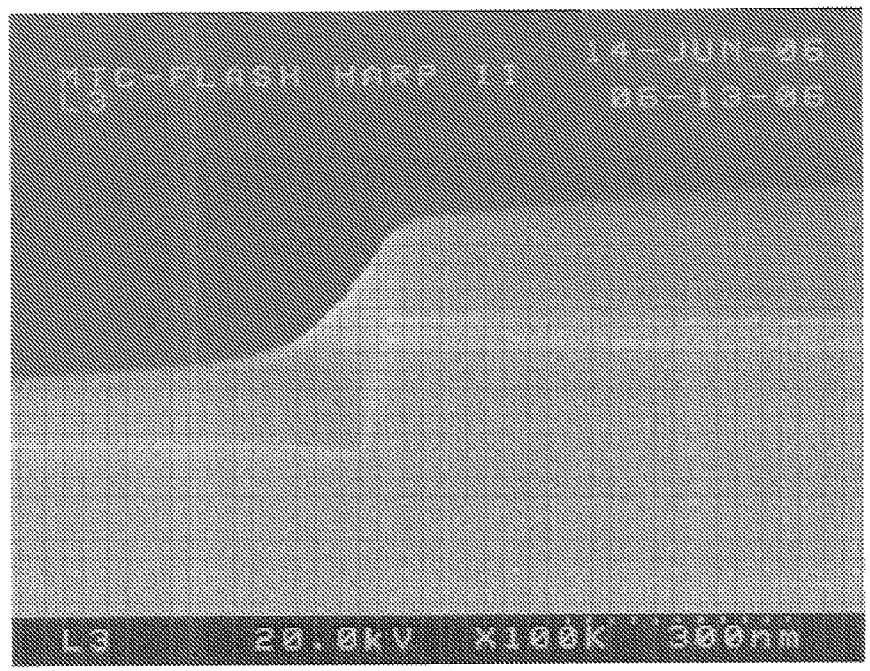

FIGS. 9A&B show comparative electron micrographs of similar substrate gaps (FIG. 9A) and a step (FIG. 9B) with the same silicon oxide dielectric as that was used in FIGS. 8A&B. However, in this comparative example the deposited dielectric was not etched before being annealed. As FIG. 9A shows, cracking of the dielectric material occurred in the gaps.

Where a range of values is provided, it is understood that each intervening value, to the tenth of the unit of the lower limit unless the context clearly dictates otherwise, between the upper and lower limits of that range is also specifically disclosed. Each smaller range between any stated value or intervening value in a stated range and any other stated or intervening value in that stated range is encompassed within the invention. The upper and lower limits of these smaller ranges may independently be included or excluded in the range, and each range where either, neither or both limits are included in the smaller ranges is also encompassed within the invention, subject to any specifically excluded limit in the stated range. Where the stated range includes one or both of the limits, ranges excluding either or both of those included limits are also included in the invention.

As used herein and in the appended claims, the singular forms "a", "and", and "the" include plural referents unless the context clearly dictates otherwise. Thus, for example, reference to "a process" may includes a plurality of such processes and reference to "the precursor" may include reference to one or more precursors and equivalents thereof known to those skilled in the art, and so forth.

Also, the words "comprise," "comprising," "include," "including," and "includes" when used in this specification and in the following claims are intended to specify the presence of stated features, integers, components, or steps, but they do not preclude the presence or addition of one or more other features, integers, components, steps, or groups.

What is claimed is:

1. A method for filling a trench in a substrate with a dielectric material, the method comprising:

filling the trench with a film of the dielectric material, wherein the dielectric film is formed by:

combining a first fluid stream comprising atomic oxygen with a second fluid stream comprising a silicon-containing precursor, and reacting the atomic oxygen and the silicon-containing precursor in a deposition chamber having an internal pressure of less than about 10 Torr to form the dielectric film in the trench, wherein dielectric material initially deposited near the top of the trench flows towards the bottom of the trench while the substrate is held at a temperature of about 30° C. to about 75° C.;

removing a top portion of the dielectric film by etching the film; and annealing the etched film.

2. The method of claim 1, wherein the dielectric film is etched back below the top of the trench.

3. The method of claim 2, wherein a capping layer is deposited on the etched back dielectric film.

4. The method of claim 3, wherein the capping layer comprises the same dielectric material as the dielectric film.

5. The method of claim 1, wherein the etching of the film is performed as a wet etch or a dry etch.

6. The method of claim 1, wherein the etching of the film is a dry etch performed by exposing the film to a etch gas comprising a fluorine compound.

* * * * *